US009673544B1

(12) United States Patent
Chen

(10) Patent No.: US 9,673,544 B1
(45) Date of Patent: Jun. 6, 2017

(54) SHORT TYPE METAL FEMALE TERMINAL AND AN LED LIGHT USING THE SAME

(71) Applicant: Bingshui Chen, Xiamen (CN)

(72) Inventor: Bingshui Chen, Xiamen (CN)

( * ) Notice: Subject to any disclaimer, the term of this patent is extended or adjusted under 35 U.S.C. 154(b) by 0 days.

(21) Appl. No.: 15/043,314

(22) Filed: Feb. 12, 2016

(51) Int. Cl.
*H05K 1/00* (2006.01)
*H01R 12/71* (2011.01)
*H01R 4/48* (2006.01)

(52) U.S. Cl.
CPC ............. *H01R 12/718* (2013.01); *H01R 4/48* (2013.01)

(58) Field of Classification Search
CPC ................................ H01R 4/48; H01R 12/718
USPC .................. 439/81, 839, 855, 860, 857, 890
See application file for complete search history.

(56) References Cited

U.S. PATENT DOCUMENTS 4,968,271 A * 11/1990 Buscella ................ H01R 13/11 439/850
7,704,103 B1 * 4/2010 Rhein .................. H01R 13/113 439/752.5
2015/0345766 A1 * 12/2015 Wang ...................... F21V 23/00 362/382
2016/0069555 A1 * 3/2016 Chen ....................... F21V 23/06 439/529

* cited by examiner

*Primary Examiner* — Abdullah Riyami
*Assistant Examiner* — Nelson R Burgos-Guntin
(74) *Attorney, Agent, or Firm* — Leong C. Lei

(57) ABSTRACT

A short type metal female terminal includes a base on which weld legs are disposed to provide an electrical connection with a light board. The base has an entrance through which a male terminal can pass. Two main elastic plates are respectively disposed at a left side and a right side of the base. The main elastic plates bend downwards and inwards, then extend oppositely to a place below the entrance, and then bend upwards to pass through the entrance. Thus, contact points of the main elastic plates opposite to each other are formed and located above the entrance. The male terminal passes between said contact points to carry out the electrical connection. The above structure is simple, and the electrical connection is more reliable.

5 Claims, 4 Drawing Sheets

SHORT TYPE METAL FEMALE TERMINAL AND AN LED LIGHT USING THE SAME

BACKGROUND OF THIS INVENTION

1. Field of this invention

This invention relates to a connector and relates particularly to a short type metal female terminal and an LED lamp which uses this short type metal female terminal.

2. Description of the Related Art

Generally, an LED lamp requires a conducting wire or wires to carry out an electrical connection. Two ends of the conducting wire are respectively welded to a light board and a drive board to supply an LED chip on the light board with electricity. However, it is quite complex to fulfill the electrical connection, and the cost of the installation of the LED lamp is also high. Therefore, an automatic installation cannot be obtained.

Some firms have invented different kinds of in-line structures each install a connector on the light board and mount a pin or pins on the drive board. The penetration of the pin into the connector can replace the conducting wire to simplify the electrical configuration of the light board and the drive board of the LED lamp, render the operation of the connection more convenient, make the processing steps easier and conduce to an automatic production.

However, the conventional in-line structures still have problems. For example, when a male terminal is inserted slantwise, the male terminal inevitably pushes the plates at two sides of the elastic clip. This situation may cause the plates to reverse upwards and become deformed and may incur a poor contact. Thus, the conventional structure still needs improvements.

SUMMARY OF THIS INVENTION

An object of this invention is to provide a short type metal female terminal which has a simple structure and a more reliable electrical connection.

Another object of this invention is to provide an LED lamp which uses the short type metal female terminal as claimed and has a simple structure and a more reliable electrical connection.

To obtain the objects, a short type metal female terminal of this invention includes a base. There can a plurality of weld legs disposed on the base to provide an electrical connection with a light board. The base has an entrance through which a male terminal passes. Two main elastic plates are respectively disposed at a left side and a right side of the base. The two main elastic plates bend downwards and inwards, then extend oppositely to a place below the entrance, and thence bend upwards to pass through the entrance and form opposite contact points above the entrance. The male terminal passes between the contact points to carry out the electrical connection.

Preferably, the entrance of the base has two opposite sides, each of which provides a subordinate elastic plate corresponding to the main elastic plate. Each subordinate elastic plate bends slantwise and upwards to prop against an outer side of each corresponding main elastic plate.

Preferably, the main elastic plates construct a mouth at the entrance. The mouth is wider in its lower portion than its upper portion.

Preferably, a top of each main elastic plate bends outwards to form a guiding part.

Preferably, each weld leg extends outwards or inwards to form a welding surface.

Preferably, the short type metal female terminal is made of a metal sheet formed by pressing and bending.

An LED lamp is further disclosed. A drive board and a light board are installed in the LED lamp. The drive board is located below the light board. The aforementioned short type metal female terminal is installed on the light board. The light board has an opening formed therethrough. The opening faces the entrance of the metal female terminal and allows an insertion of the male terminal. The male terminal can be installed on or integrally formed with the drive board. The male terminal passes through the entrance of the short type metal female terminal and comes into contact with the contact points of the main elastic plates, thereby carrying out the electrical connection.

By comparison with the conventional art, this invention takes advantage of the weld legs of the base to be in electrical connection with the light board. Main elastic plates at two opposite sides of the base bend downwards, then inwards, and thence upwards to form respective contact points. The male terminal on the drive board can pass between the main elastic plates to provide an electrical connection. Thus, the main elastic plates are enhanced, and a normal force of the female terminal is also increased to prevent the deformation and the poor contact caused by the insufficient normal force of the female terminal. The occurrence of the broken female terminal which is due to the slanting insertion of the male terminal can also be prevented. The structure of this invention is simple, and this invention is convenient to fulfill the connection and is easy to install and process. Thus, an automatic production can be obtained.

The LED lamp of this invention has a simple structure and a more reliable electrical connection because of the installation of the claimed female terminal.

The advantages of this invention are more apparent upon reading the following descriptions in conjunction with the drawings.

DETAILED DESCRIPTION OF THE PREFERRED EMBODIMENTS

Referring to FIGS. 1 to 6, a short type metal female terminal 10 of this invention is shown and has a base 11.

Figure 1:
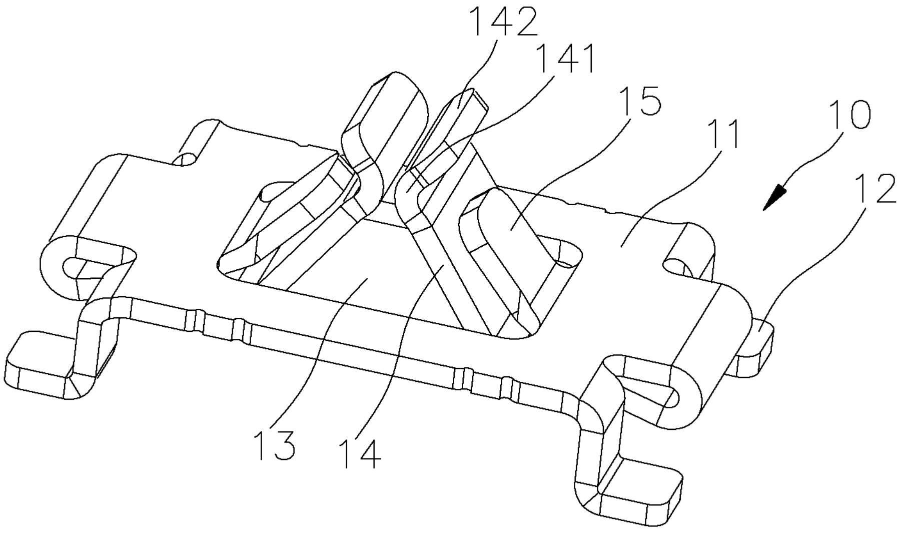
FIG. 1 is a perspective view showing a first preferred embodiment of this invention.
Figure 2:
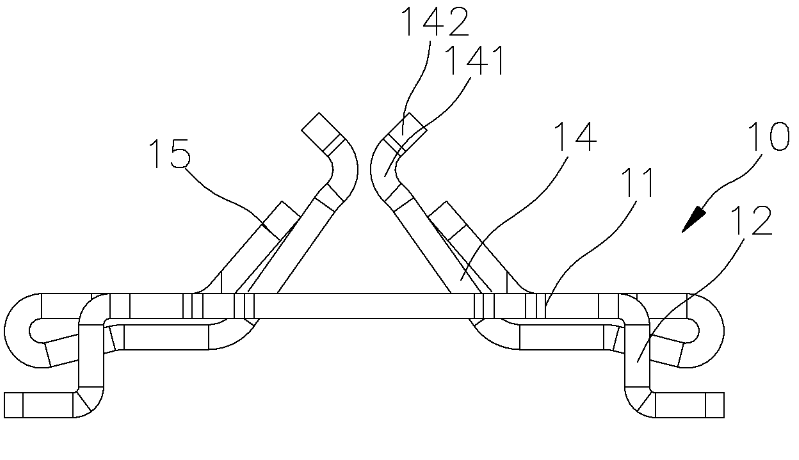
FIG. 2 is a side elevational view showing the first preferred embodiment of this invention.
Figure 3:
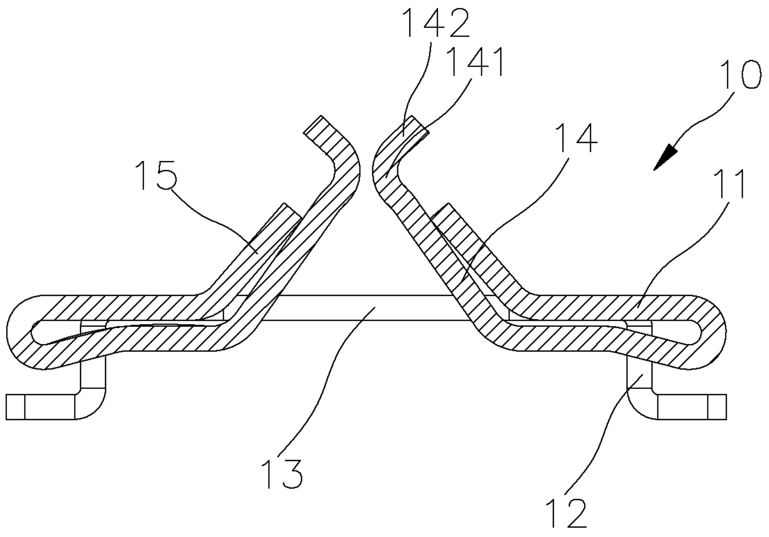
FIG. 3 is a cross-sectional view of FIG. 2.
Figure 4:
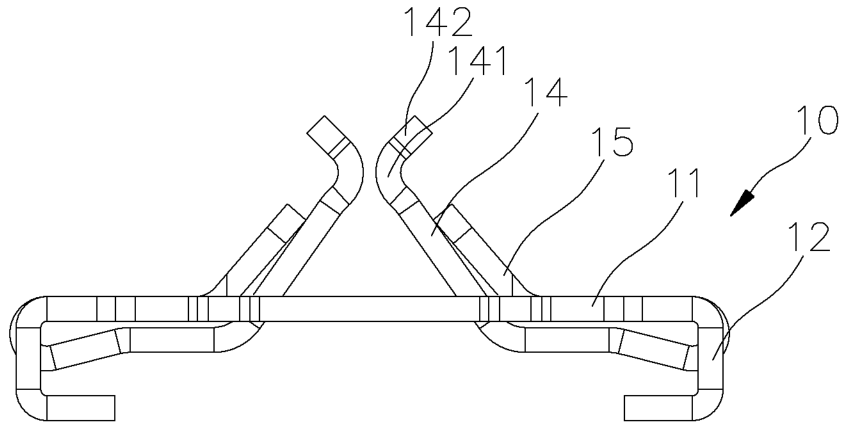
FIG. 4 is a side elevational view showing a second preferred embodiment of this invention.

There are weld legs 12 disposed on the base 11 to provide an electrical connection with a light board 20. To connect the weld legs 12 with the light board 20 conveniently, the first preferred embodiment shows that each weld leg 12 extends outwards to make an additional welding surface, as shown in FIGS. 1 to 3. Alternatively, the second preferred embodiment shows that each weld leg 12 extends inwards to make the welding surface, as shown in FIG. 4.

An entrance 13 is formed through the base 11 so that a male terminal 30 can pass through the entrance 13.

A main elastic plate 14 is disposed at a left side of the base 11, and another elastic plate 14 is disposed at a right side of the base 11. The two elastic plates 14 bend downwards and inwards, then extend oppositely to a place below the entrance 13, and thence bend upwards to pass through the entrance 13 and form respective contact points 141 which are opposite to each other. The contact points 141 are located above the entrance 13. The male terminal 30 passes between the contact points 141 to carry out an electrical connection. To insert the male terminal 30 more smoothly, the two main elastic plates 14 construct a mouth, which is wider in its lower portion than its upper portion, at the entrance 13, as shown in FIG. 3. Furthermore, a top of each main elastic plate 14 bends outwards to form a guiding part 142.

The entrance 13 of the base 11 has two opposite sides on which subordinate elastic plates 15 are respectively disposed. The subordinate elastic plates 15 respectively correspond to main elastic plates 14. The subordinate elastic plates 15 bend slantwise and upwards to prop against an outer side of the corresponding main elastic plates 14 respectively.

This invention can be made of a metal sheet formed by pressing and bending. After the base 11 is bent, the main elastic plates 14 and the subordinate elastic plates 15 surround the entrance 13 of the base 11 to attain a small and short structure, so-called a short type metal female terminal.

Referring to FIGS. 1 to 4, the structure of this invention is simple and has a low processing cost. If an electrical connection is to be executed, the male terminal 30 on a drive board 40 passes through the entrance 13 of the base 11 and comes into contact with the specific contact points 141 of the main elastic plates 14 to carry out the electrical connection. It is convenient to operate the connection and is easy to install and process. Thus, an automatic production can be obtained. Further, the main elastic plates 14 are not broken and deformed by an improper insertion of the male terminal 30, thereby assuring the reliability of the electrical connection. This invention further uses the subordinate elastic plates 15 to allow the subordinate elastic plates 15 and the main elastic plates 14 to bear the force together. Therefore, the strength of the plates is good, and the deformation of the plates is prevented. If the male terminal 30 is inserted slantwise, the subordinate elastic plates 15 prop against the main elastic plates 14 to provide a supporting and protecting effect and ensure that the main elastic plates 14 are not broken by the press of the male terminal. Accordingly, the electrical connection is more reliable.

Figure 5:
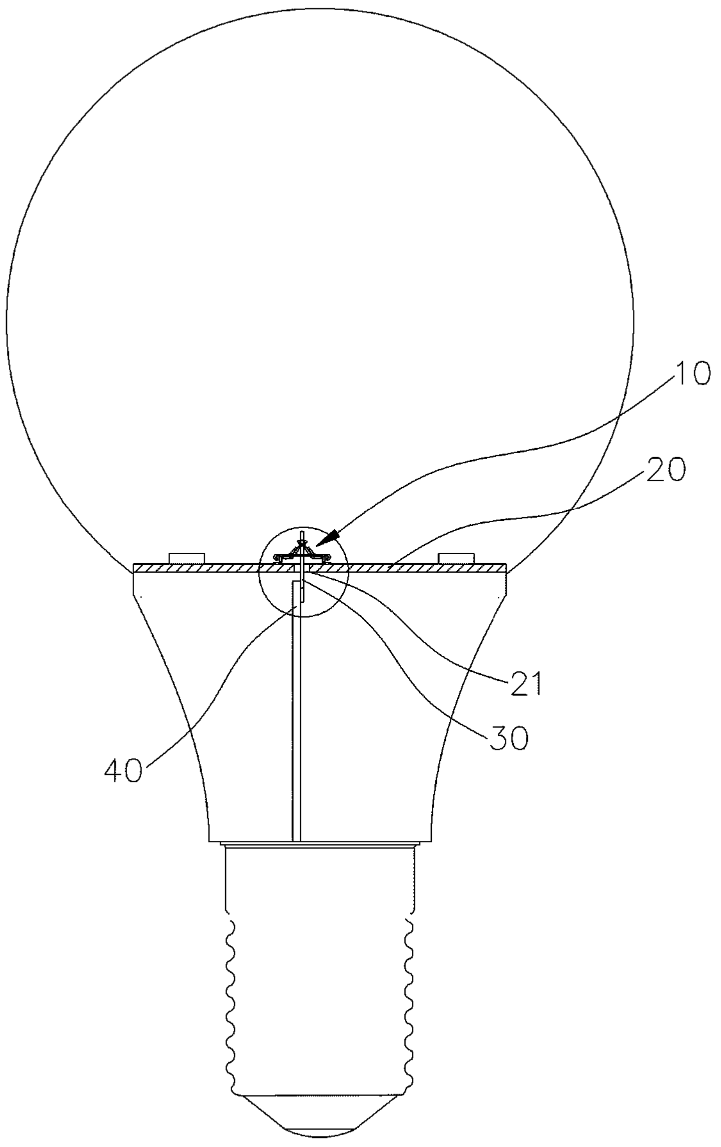
FIG. 5 is a schematic view showing an LED lamp in combination with the metal female terminal of this invention.
Figure 6:
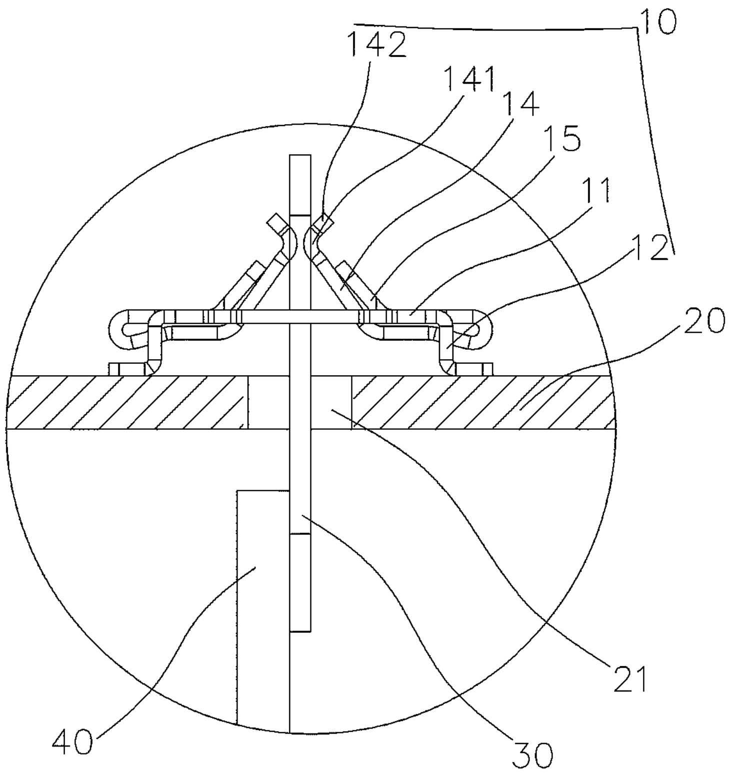
FIG. 6 is an enlarged view of FIG. 5.

Referring to FIG. 5 and FIG. 6, the short type metal female terminal 10 of this invention can be applied to an LED lamp where a drive board 40 and a light board 20 are mounted. The drive board 40 is located below the light board 20. The short type female terminal 10 is installed on the light board 20. The light board 20 has an opening 21 which faces the entrance 13 so that the male terminal 30 can pass therethrough. The male terminal 30 can be installed on or integrally formed with the drive board 40. The male terminal 30 passes through the entrance 13 of the short type metal female terminal 10 to be in contact with the contact points 141 of the main elastic plates 14. Thus, the electrical connection is attained to provide illumination.

While the embodiments of this invention are shown and described, it is understood that further variations and modifications may be made without departing from the scope of this invention.

What is claimed is:

1. A short type metal female terminal comprising a base in the form of a single flat board having a first side edge and a second side edge that are opposite to and distant from each other, a plurality of weld legs being disposed on said base to provide an electrical connection with a light board, said base having an opening forming an entrance to receive a male terminal to extend therethrough, two main elastic plates being respectively and integrally extending from the left side edge and the right side edge of said base, such that said two main elastic plates extend outward away from each other and then bend downwards and extend inwards along and under an undersurface of the flat board of the base in a direction toward each other to reach a place below said entrance, and thence bend upwards to pass through said entrance to form opposite contact points above said entrance and located above a top surface of the flat board, wherein said male terminal extending through the entrance is receivable between said contact points to carry out said electrical connection;

wherein the opening that forms the entrance of the base has two opposite inner side edges respectively corresponding to the left side edge and the right side edge of the flat board and two subordinate elastic plates respectively and integrally extending from the opposite inner side edges of the opening, the subordinate elastic plates being separate from and corresponding to the main elastic plates respectively and arranged to be in contact with the main elastic plates at outer side surfaces of the main elastic plates that are opposite to each other to respectively support the main elastic plates.

2. The short type metal female terminal according to claim 1, wherein said two main elastic plates construct a mouth at said entrance, said mouth being wider in a lower portion and narrower in an upper portion.

3. The short type metal female terminal according to claim 1, wherein a top of each of said two main elastic plates bends outwards to form a guiding part.

4. The short type metal female terminal according to claim 1, wherein each of said plurality of weld legs extends outwards or inwards to form a welding surface.

5. The short type metal female terminal according to claim 1 being made of a metal sheet formed by pressing and bending.

* * * * *